(12) United States Patent
Song

(10) Patent No.: US 7,671,617 B2
(45) Date of Patent: Mar. 2, 2010

(54) TEST SYSTEM TO TEST MULTI-CHIP PACKAGE COMPENSATING A SIGNAL DISTORTION

(75) Inventor: Ki-Jae Song, Paju-si (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 11/983,110

(22) Filed: Nov. 7, 2007

(65) Prior Publication Data

US 2008/0106296 A1    May 8, 2008

(30) Foreign Application Priority Data

Nov. 7, 2006    (KR)    ...................... 10-2006-0109436

(51) Int. Cl.
*G01R 31/26*    (2006.01)

(52) U.S. Cl. ...................... 324/765; 324/763

(58) Field of Classification Search ...................... None
See application file for complete search history.

(56) References Cited

U.S. PATENT DOCUMENTS

| | | | |
|---|---|---|---|
| 5,898,628 A * | 4/1999 | Mielke et al. | ................ 365/201 |
| 6,208,225 B1 | 3/2001 | Miller | |
| 6,286,117 B1 | 9/2001 | Yun et al. | |
| 6,943,577 B2 | 9/2005 | Shin et al. | |
| 6,982,479 B2 | 1/2006 | Nishijima, et al. | |
| 7,222,274 B2 * | 5/2007 | Combs et al. | ................ 714/721 |
| 7,327,154 B2 | 2/2008 | Shin et al. | |
| 2004/0119491 A1 | 6/2004 | Shin et al. | |
| 2005/0258858 A1 | 11/2005 | Shin et al. | |
| 2006/0151866 A1 | 7/2006 | Lee | |

FOREIGN PATENT DOCUMENTS

| | | |
|---|---|---|
| JP | 6-140451 | 5/1994 |
| JP | 2002-538609 | 11/2002 |
| JP | 2005-33154 | 2/2005 |
| KR | 100224731 B1 | 7/1999 |
| KR | 2001-0104352 | 11/2001 |
| KR | 1020040029537 A | 4/2004 |
| KR | 1020060081101 A | 7/2006 |
| WO | WO 00/51232 | 8/2000 |

* cited by examiner

*Primary Examiner*—Vinh P Nguyen
(74) *Attorney, Agent, or Firm*—Mills & Onello LLP

(57) ABSTRACT

A test system includes: a tester; and a test board, on which a multi-chip package including plural memories is mounted, being connected to the tester by way of a transmission line. The transmission line includes a compensation unit for compensating signal distortion.

17 Claims, 7 Drawing Sheets

TEST SYSTEM TO TEST MULTI-CHIP PACKAGE COMPENSATING A SIGNAL DISTORTION

CROSS-REFERENCE TO RELATED APPLICATIONS

This U.S. non-provisional patent application claims priority under 35 U.S.C. § 119 of Korean Patent Application No. 10-2006-0109463 filed on Nov. 7, 2006, the entire contents of which are incorporated herein by reference.

BACKGROUND

The present invention disclosed herein relates to test systems and more particularly, to a test system for a multi-chip package including pluralities of memories (or memory chips).

Many applications are ever demanding improvement of data rate and large capacity of storage. For those requirements, memory manufacturers now drive their fabrication facilities into multi-chip packages (MCPs).

For the purpose of reducing the number of solder balls when pluralities of memory chips are stacked on a printed circuit board (PCB), an MCP is made by assembling the stacked memory chips through common pins thereof by means of a wire-bonding process on the PCB. An increasing number of stacked memory chips or a decreasing number of solder balls reduces the number of branches by wire-bonding. And, while signals transferred to plural chips at the same time diverge through wire-bonded paths, capacitive values existing in plural memory chips become larger to increase a time constant. Therefore, in a test system, there is a problem of deteriorating the integrity of input signals transferred to an MCP in which plural memory chips are stacked.

SUMMARY OF THE INVENTION

The present invention is directed to a test system for an MCP, minimizing reflection waves of input signals and improving eye window characteristics.

An aspect of the present invention is a test system comprising: a tester; and a test board, on which a multi-chip package including plural memories is mounted, being connected to the tester by way of a transmission line. The transmission line includes a compensation unit for compensating signal distortion.

The multi-chip package can include the plural memories wire-bonded to each other in parallel.

The compensation unit can be an inductor.

The inductor can be disposed on the transmission line.

A reflection wave can be minimized by the system at an operating frequency of the plural memories.

A resonance frequency can be optimized to an operating frequency of the plural memories by the system.

An eye-open window of the system can be maximized by raising an L/R time constant at an operating frequency of the plural memories.

The tester can be configured to apply a test pattern to the plural memories by way of the transmission line at the same time.

The plural memories can be configured to output resultant data in sequence from the test pattern.

In accordance with another aspect of the present invention, provided is a test system comprising: a tester; a test board on which a multi-chip package including plural memories are mounted; and a transmission line connecting the tester with the test board, to which a compensation unit is connected for compensating signal distortion.

The compensation unit can be an inductor.

The inductor can be connected to a bonding wire in the multi-chip package.

A reflection wave can be minimized at an operating frequency of the plural memories by the system.

A resonance frequency can be optimized to an operating frequency of the plural memories by the system.

An eye-open window of the system can be maximized by raising an L/R time constant at an operating frequency of the plural memories.

The tester can be configured to apply a test pattern to the plural memories by way of the transmission line at the same time.

The plural memories can be configured to output resultant data in sequence from the test pattern.

BRIEF DESCRIPTION OF THE FIGURES

Non-limiting and non-exhaustive embodiments in accordance with the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
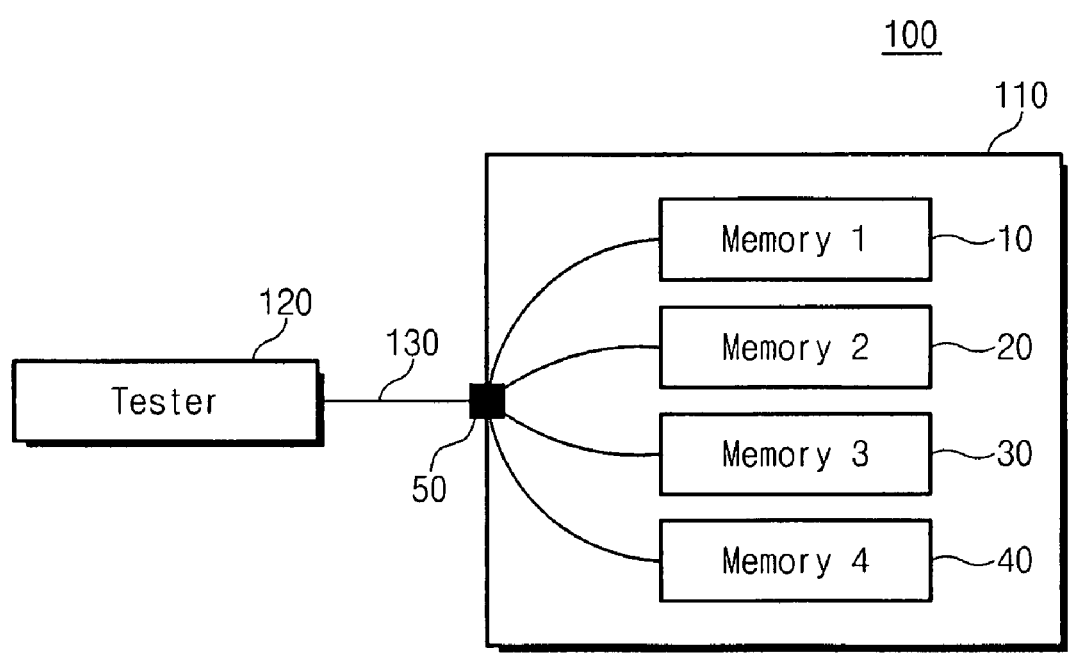
FIG. 1 is a block diagram showing an embodiment of a test system for testing a multi-chip package.

Preferred embodiments in accordance with aspects of the present invention will be described below in more detail with reference to the accompanying drawings. The present invention may, however, be embodied in different forms and should not be constructed as limited to the embodiments set forth herein. Like reference numerals refer to like elements throughout the accompanying figures.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

FIG. 1 is a block diagram showing an embodiment of a test system for testing an multi-chip package (MCP). Referring to FIG. 1, the test system 100 is organized of an MCP 110, a tester 120, and a transmission line 130.

The tester 120 provides the transmission line 130 with a test pattern for testing memories (or memory chips) 10~40 on the MCP 110. A test pattern transferred from the transmission line 130 is applied to each of the memories 10~40 by way of bonding wires from a common pin 50 of the MCP 110. The memories 10~40 provides the tester 120 with results arising from the test pattern.

Figure 2:
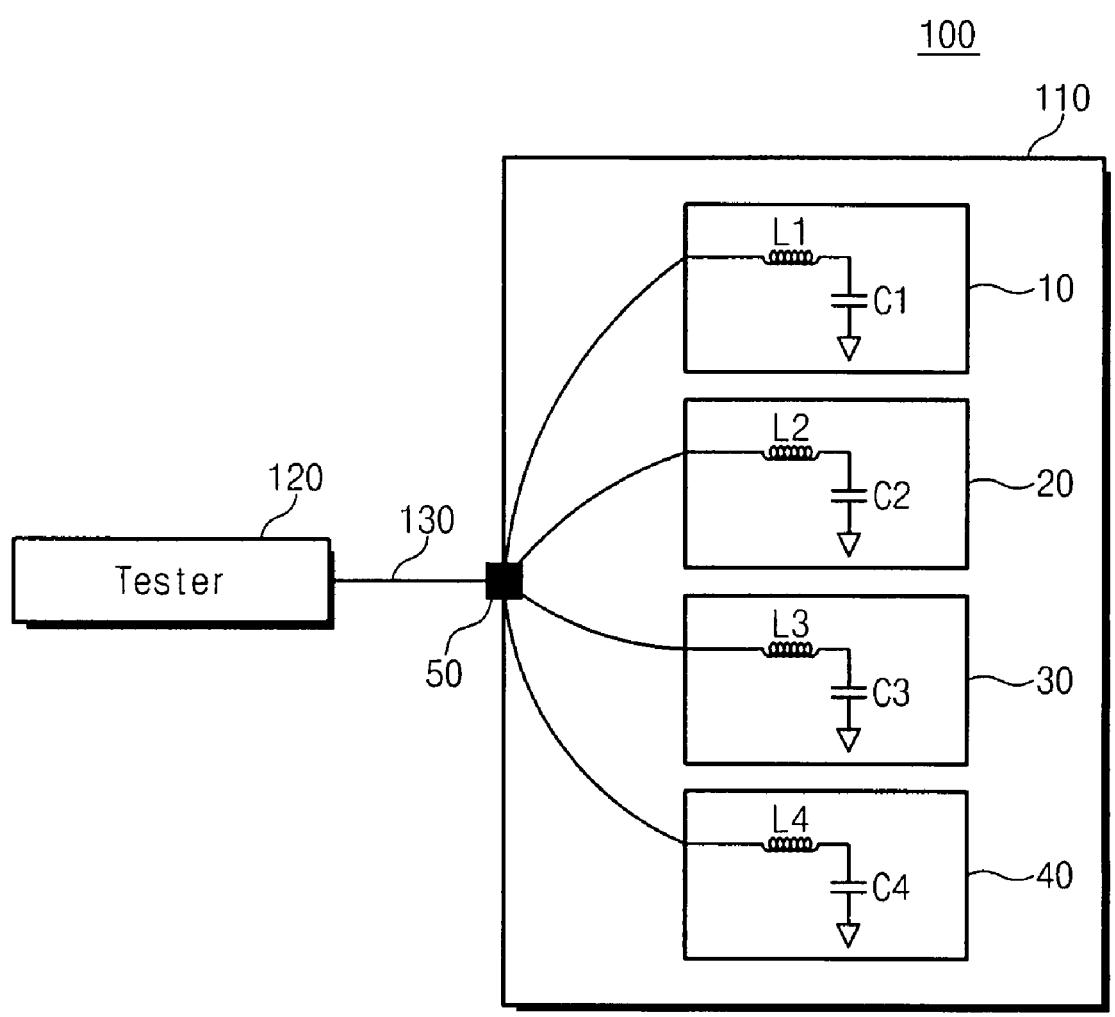
FIG. 2 is a block diagram showing an embodiment modeling the memories of FIG. 1 to inductors and capacitors.
Figure 3:
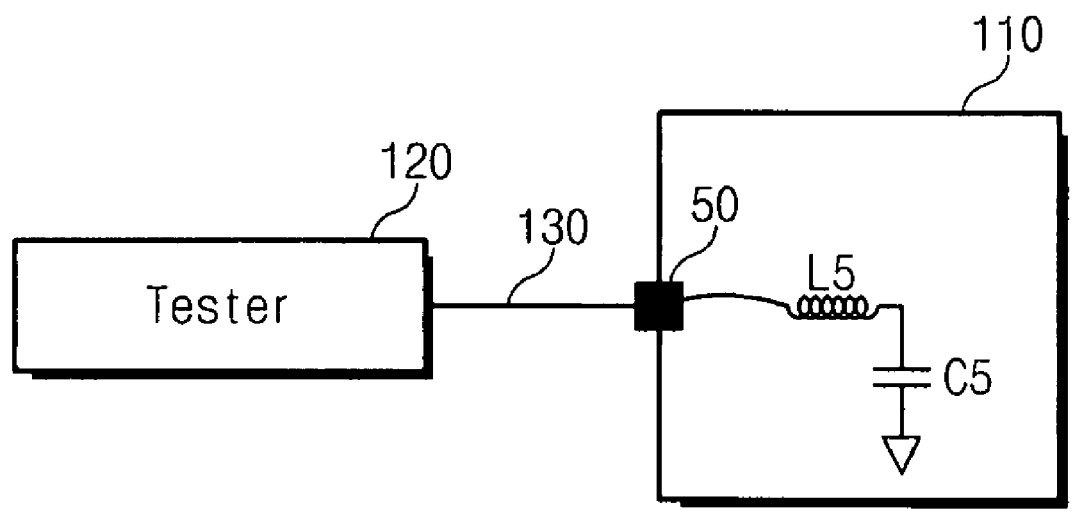
FIG. 3 is a block diagram showing an embodiment modeling the memory models of FIG. 2 into a single inductor and capacitor.

FIG. 2 is a block diagram showing an embodiment modeling the memories 10~40 of FIG. 1 to inductors and capacitors, and FIG. 3 is a block diagram showing an embodiment modeling the memory models of FIG. 2 into a single inductor and capacitor.

Referring to FIG. 2, the memories 10~40 branching from the transmission line 130 can be modeled into pairs of inductors and capacitors.

For instance, the first memory 10 is modeled into a first inductor L1 and a first capacitor C1. In detail, the first inductor L1 is connected between the transmission line 130 and the first capacitor C1. The first capacitor C1 is coupled between the first inductor L1 and the ground voltage. The second memory 20 is modeled into a second inductor L2 and a second capacitor C2. In detail, the second inductor L2 is connected between the transmission line 130 and the second capacitor C2. The second capacitor C2 is coupled between the second inductor L2 and the ground voltage. The third memory 30 is modeled into a third inductor L3 and a third capacitor C3. In detail, the third inductor L3 is connected between the transmission line 130 and the third capacitor C3. The third capacitor C3 is coupled between the third inductor L3 and the ground voltage. The fourth memory 40 is modeled into a fourth inductor L4 and a fourth capacitor C4. In detail, the fourth inductor L4 is connected between the transmission line 130 and the fourth capacitor C4. The fourth capacitor C4 is coupled between the fourth inductor L4 and the ground voltage.

As shown in FIG. 2, the memories 10~40 are arranged with pairs of inductance L1~L4 and capacitance L1~L4. As many as the memories branch from the transmission line 130, the inductance becomes smaller by division, as much as the number of branches, while the capacitance becomes larger by multiplication. In other words, as illustrated in FIG. 3, the models of the memories 10~40 can be simplified into a single inductor L5 and a single capacitor C5.

$$L1=L2=L3=L4=L \quad \text{[Equation 1]}$$

$$C1=C2=C3=C4=C \quad \text{[Equation 2]}$$

$$L5=L/4 \quad \text{[Equation 3]}$$

$$C5=4C \quad \text{[Equation 4]}$$

As noticed by Equations 1 and 2, assuming that inductance of the inductors and capacitance of the capacitors are all same in each of the memories 10~40, L5 and C5 of FIG. 3 may be arranged as given by Equations 3 and 4.

For example, assuming that L1, L2, L3, and L4 of the memories 10~40 are 3 nH and C1, C2, C3, and C4 of the memories 10~40 are 3 pF, L5 and C5 are valued in 0.75 nH and 12 pF, respectively, by Equations 3 and 4.

$$\omega_0 = \frac{1}{\sqrt{L \cdot C}} \quad \text{[Equation 5]}$$

$$f_0 = \frac{\omega_0}{2 \cdot \pi} \quad \text{[Equation 6]}$$

Restating Equations 5 and 6 with L5 and C4, it may result in:

$$\omega_0 = \frac{1}{\sqrt{0.75 \cdot 10^{-9} \times 12 \cdot 10^{-12}}} \cong 10.4 \times 10^9$$

$$f_0 = \frac{10.4 \times 10^9}{2 \cdot \pi} = 1.6 \times 10^9 = 1.65 \text{ GHz}$$

When an operating frequency of the test system by the memories shown in FIG. 3 is 400 MHz, a resonance frequency ranges in the frequency band of 1.65 GHz. In other words, a reflection wave is lowest at the band of 1.65 GHz, but relatively large on other frequency bands. Reflection wave means a ratio of reception signal to transmission signal. When a reflection wave is low, a transmission signal is delivered with smaller loss.

Thus, if there is a high reflection wave at the operating frequency of the memory, signal integrity by the test system is deteriorated.

Systems in accordance with the present invention restrain generation of reflection waves by shifting a resonance frequency toward an operating frequency, thereby improving signal integrity of the test system.

In accordance with the present invention, a structure can be provided where an inductor is inserted into an input of a frequency divider in a test board, compensating inductance lowered by parallel connection. In accordance with the present invention, there can be provided a facility to minimize generation of reflection waves by making a resonance frequency appear at an operating frequency.

Figure 4:
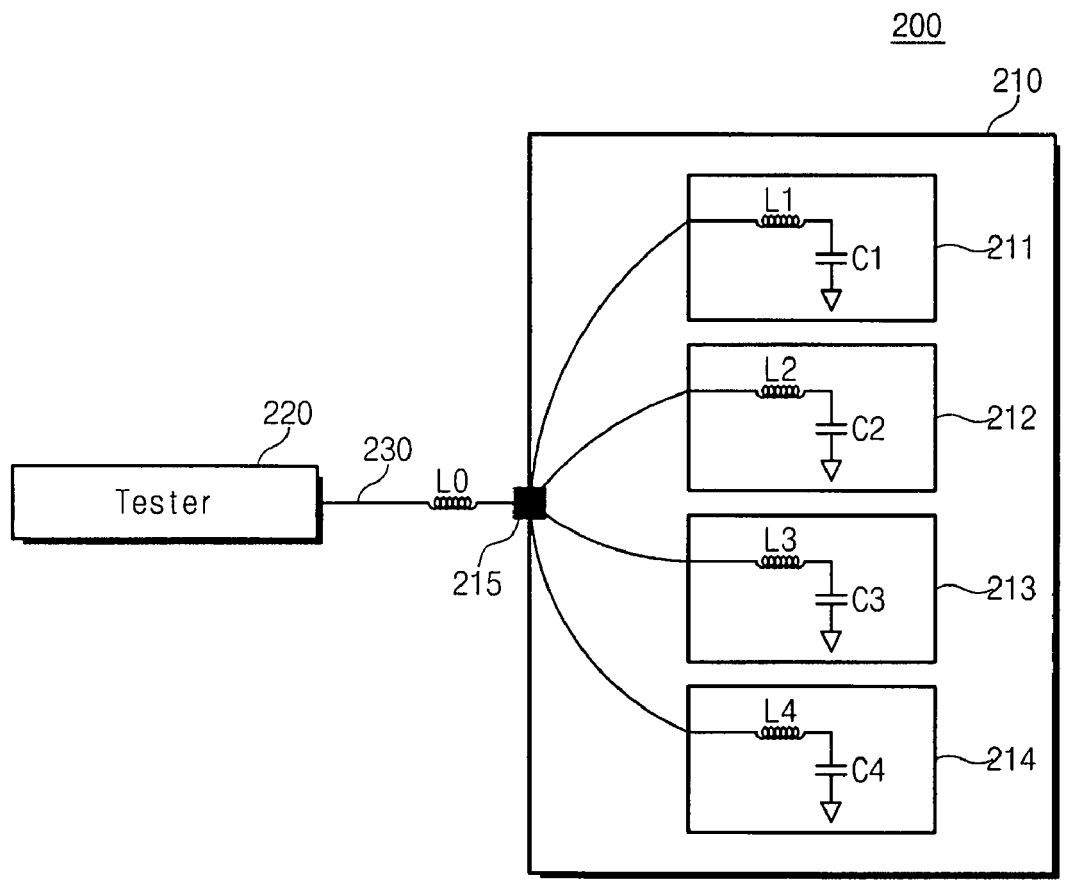
FIG. 4 is a block diagram of an embodiment of a test system according to an aspect of the present invention.

FIG. 4 is a block diagram of an embodiment of a test system according to an aspect of the present invention. The test system shown in FIG. 4 is similar to the test system 100 shown in FIG. 2, so will not be further described. According to FIG. 4, the test system 400 is comprised of an MCP 210 including memories, a tester 220, and a transmission line 230. The MCP 210 is formed with an inductor L0 on the transmission line 230 so as to shift a resonance frequency to an operating frequency.

Figure 5:
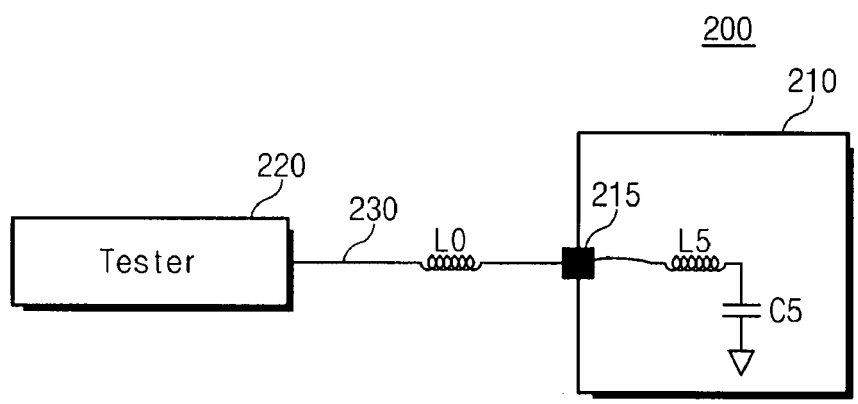
FIG. 5 is a block diagram showing an embodiment modeling the memory models 211~214 and the inductor L0 into two inductors and a single capacitor.

FIG. 5 is a block diagram showing an embodiment modeling the memory models 211~214 and the inductor L0 into two inductors and a single capacitor.

According to FIG. 5, the models of the memories 211~214 and the inductor L0 are reformed in the configuration with a first inductor L0, a second inductor L5, and a capacitor C5.

For instance, assuming that L1, L2, L3, and L4 of the memories 211~214 are 3 nH and C1, C2, C3, and C4 of the memories 211~214 are 3 pF, L5 and C4 are valued in 0.75 nH and 12 pF, respectively, by Equations 3 and 4.

$$L = \frac{1}{C} \cdot \left(\frac{1}{2\pi f_0}\right)^2 \quad \text{[Equation 7]}$$

Assuming that the operating frequency $f_0$ of the memories 211~214 is 400 MHz, Equation 7 is used to obtain inductance of the inductor L0 that is inserted into the input of the MCP 210. Equation 7 results from inserting Equations 5 and 6 thereinto.

The inductor L0 inserted into the test board is valued in 13.2 nH.

$$L = \frac{1}{12 \times 10^{-9}} \cdot \left(\frac{1}{2\pi \cdot 400 \times 10^6}\right)^2 = 13.2 \times 10^{-9}$$

In accordance with the present invention, a resonance frequency is optimized at the operating frequency by settling an inductor on the transmission line of the test system for testing the MCP. Thus, it makes a branched memory resonating in the operating frequency by adjusting an inductance value of the branched memory in the MCP, minimizing generation of reflection waves from input signals and improving eye window characteristics.

Moreover, in accordance with aspects of the present invention, it is permissible to shift a resonance frequency to the operating frequency by combining another element unit in addition to an inductor on the transmission line of the test system for testing the MCP. For instance, it is possible to move a frequency of an input signal of the test board by means of a combination of inductors and capacitors, and capacitors.

Improvement of signal integrity can be found by comparing eye window levels therewith.

As shown in FIGS. 6-10, a rectangle in the graphs is generally defined as an "eye open window." Generally, the eye open window features the characteristics of the transmitted signal. An eye diagram shows eye-shaped waveforms (that is, "eye open window") appearing when binary bits '001', '010', '011', '100', '101', and '110' are applied to an input signal transferred through the transmission line. In the eye diagram, as an eye-open window is larger, it means the test system is good in signal integrity.

Figure 6:
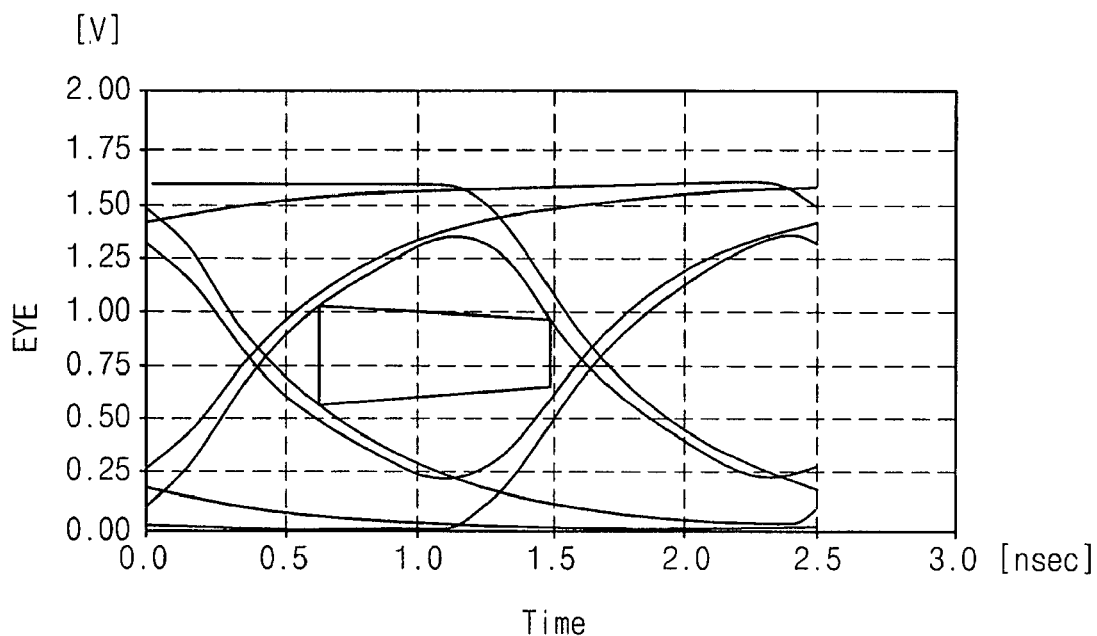
FIG. 6 is an eye diagram plotting signal integrity in the data rate of 800 Mbps as a general case.
Figure 7:
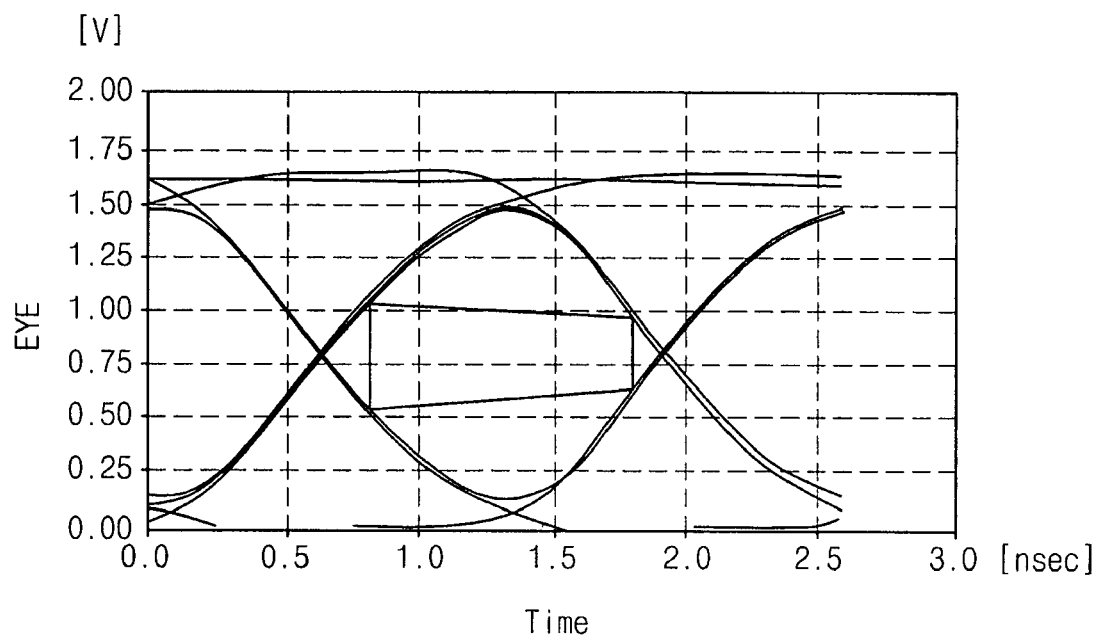
FIG. 7 is an eye diagram plotting signal integrity in the data rate of 800 Mbps when an inductor is inserted into a test board.

FIG. 6 is an eye diagram plotting signal integrity in the data rate of 800 Mbps as a general case, and FIG. 7 is an eye diagram plotting signal integrity in the data rate of 800 Mbps when an inductor is inserted into the test board.

Referring to FIGS. 6 and 7, an eye-open window of FIG. 7 is larger than that of FIG. 6. In other words, FIG. 7 shows a result of signal integrity better than FIG. 6 by about 10%.

Figure 8:
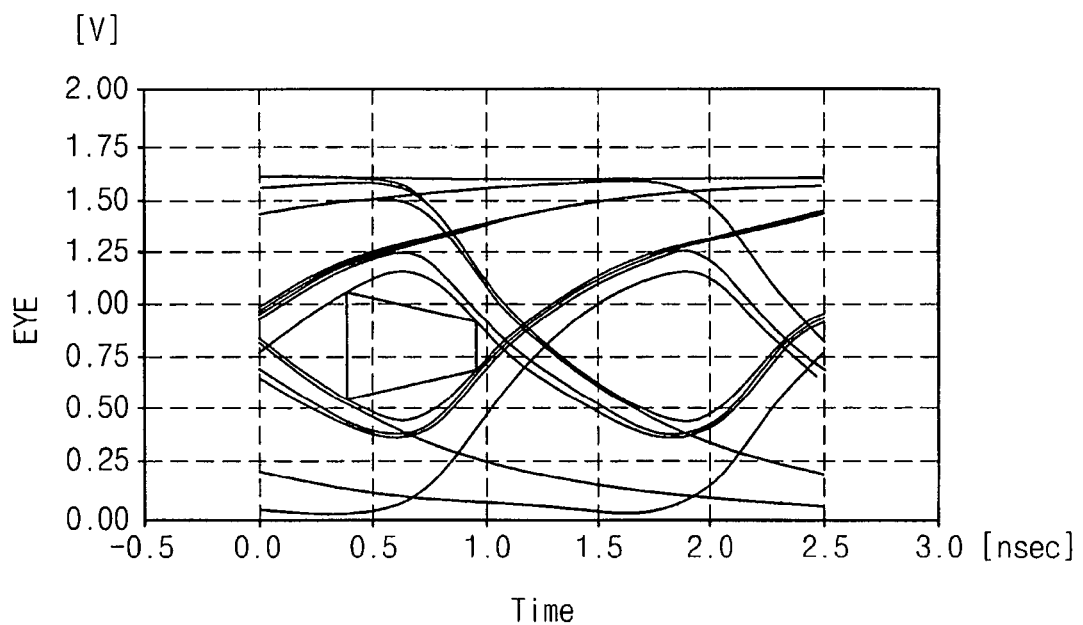
FIG. 8 is an eye diagram plotting signal integrity in the data rate of 1080 Mbps as a general case.
Figure 9:
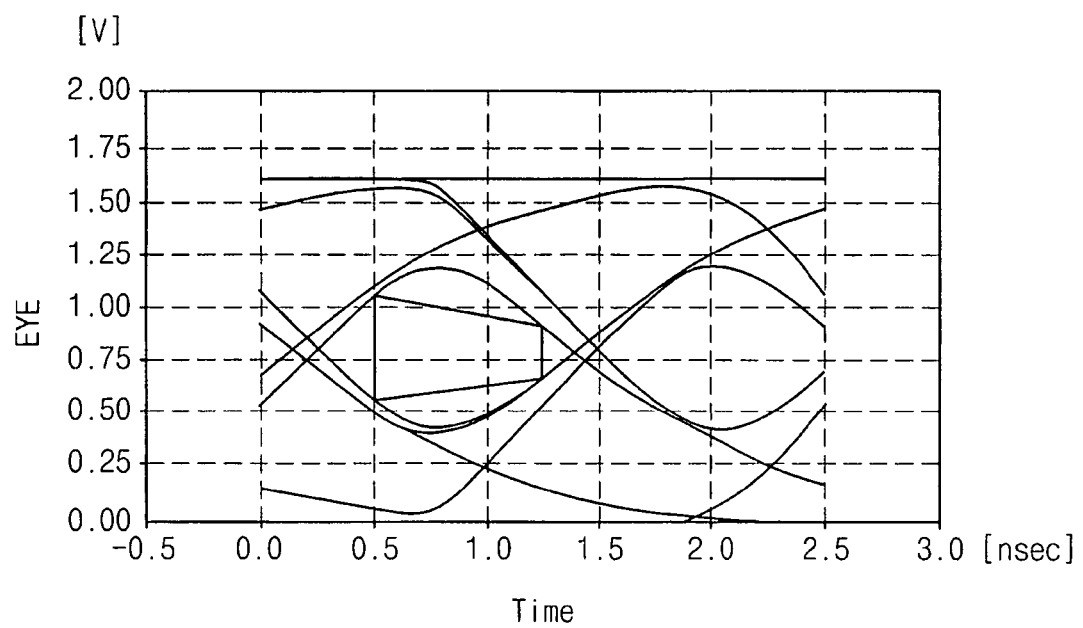
FIG. 9 is an eye diagram plotting signal integrity in the data rate of 1080 Mbps when an inductor is inserted into a test board.

FIG. 8 is an eye diagram plotting signal integrity in the data rate of 1080 Mbps as a general case, and FIG. 9 is an eye diagram plotting signal integrity in the data rate of 1080 Mbps when an inductor is inserted into a test board. Referring to FIGS. 8 and 9, an eye-open window of FIG. 9 is larger than that of FIG. 8. In other words, signal integrity of eye-open is improved by about 12% when a resonance frequency is rendered to match with 540 MHz by inserting optimum inductance in the condition of four branches under the data-rate of 1080 Mbps.

Figure 10:
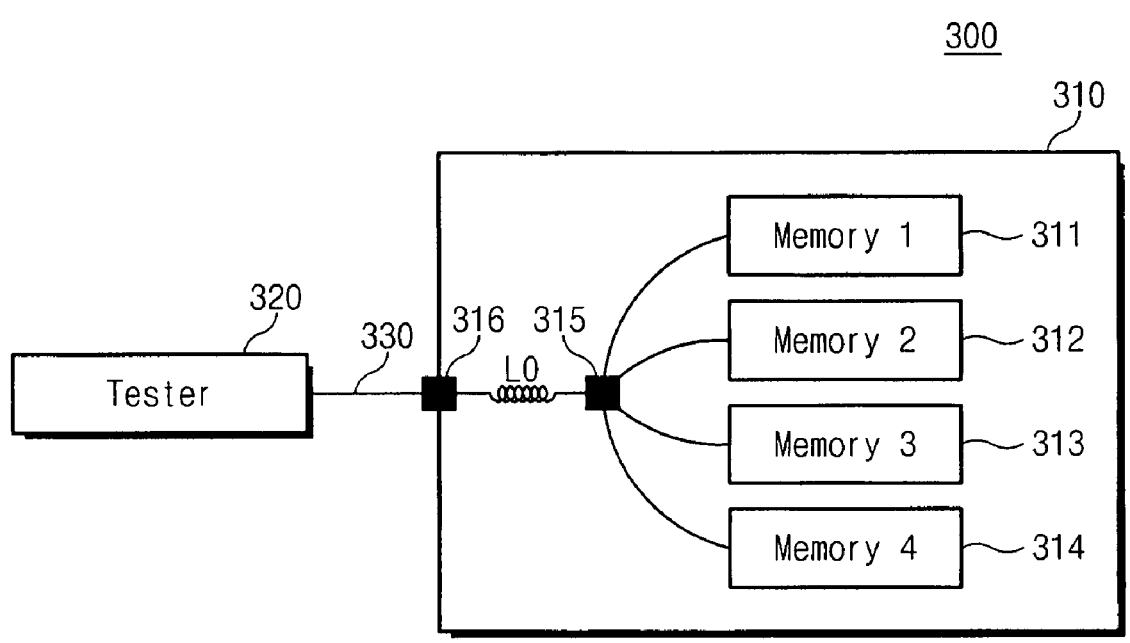
FIG. 10 is a block diagram of an embodiment of a test system according to another aspect of the present invention.

FIG. 10 is a block diagram of an embodiment of a test system according to another aspect of the present invention. The test system 300 shown in FIG. 10 is similar to the test system 200 shown in FIG. 4, so will not be described further. Referring to FIG. 10, the test system 300 is comprised of an MCP 310, a tester 320, and a transmission line 330. The MCP 210 includes an inductor L0 between a common pin 315 and a solder ball 316, for shifting a resonance frequency to an operating frequency.

As described above, with the inductor provided on the transmission line of the test system for testing the MCP, it is able to optimize a resonance frequency on the operating frequency of the memories, minimizing reflection waves of input signals and improving eye window characteristics relevant to signal integrity.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A test system comprising:
   a tester; and
   a multi-chip package including plural memories being connected to the tester by way of a transmission line,
   wherein the transmission line includes a compensation unit for converting a resonance frequency of the plural memories into an operation frequency of the plural memories to compensate a signal distortion produced on the transmission line.

2. The test system as set forth in claim 1, wherein the multi-chip package includes the plural memories wire-bonded to each other in parallel.

3. The test system as set forth in claim 1, wherein the compensation unit includes an inductor.

4. The test system as set forth in claim 3, wherein the inductor is disposed on the transmission line.

5. The test system as set forth in claim 3, wherein an eye-open window for indicating a characteristic of signal transmission is maximized by tuning the inductor value at the operating frequency of the plural memories.

6. The test system as set forth in claim 1, wherein the signal distortion is minimized at an operating frequency of the plural memories.

7. The test system as set forth in claim 1, wherein the resonance frequency is optimized to the operating frequency of the plural memories.

8. The test system as set forth in claim 1, wherein the tester is configured to apply a test pattern to the plural memories by way of the transmission line at the same time.

9. The test system as set forth in claim 1, wherein the plural memories are configured to output resultant data in sequence from the test pattern.

10. A test system comprising:
    a tester;

a multi-chip package including plural memories connected to the tester by way of a transmission line; and a bonding wire connected to the plural memories, wherein the bonding wire includes at least a compensation unit for converting a resonance frequency into an operation frequency to compensate a signal distortion produced on the transmission line.

11. The test system as set forth in claim 10, wherein the compensation unit includes an inductor.

12. The test system as set forth in claim 11, wherein the inductor is connected to the bonding wire in the multi-chip package.

13. The test system as set forth in claim 11, wherein an eye-open window for indicating a characteristic of signal transmission is maximized by tuning the inductor value at the operating frequency of the plural memories;

wherein an eye-open window for indicating a characteristic of signal transmission is maximized by raising an L/R time constant of the plural memories at an operating frequency of the plural memories.

14. The test system as set forth in claim 10, wherein the signal distortion is minimized at an operating frequency of the plural memories.

15. The test system as set forth in claim 10, wherein the resonance frequency is optimized to the operating frequency of the plural memories.

16. The test system as set forth in claim 10, wherein the transmission line connects the bonding wire to the tester, and wherein the tester is configured to apply a test pattern to the plural memories by way of the transmission line at the same time.

17. The test system as set forth in claim 10, wherein the plural memories can be configured to output resultant data in sequence from the test pattern.

* * * * *

UNITED STATES PATENT AND TRADEMARK OFFICE
CERTIFICATE OF CORRECTION

| | | |
|---|---|---|
| PATENT NO. | : 7,671,617 B2 | Page 1 of 1 |
| APPLICATION NO. | : 11/983110 | |
| DATED | : March 2, 2010 | |
| INVENTOR(S) | : Ki-Jae Song | |

It is certified that error appears in the above-identified patent and that said Letters Patent is hereby corrected as shown below:

On the cover page, Section (30) Foreign Application Priority Data, please remove "10-2006-0109436" and insert --10-2006-0109463--

Signed and Sealed this

Eighteenth Day of May, 2010

David J. Kappos
*Director of the United States Patent and Trademark Office*